United States Patent
Kim

(10) Patent No.: US 7,881,136 B2
(45) Date of Patent: Feb. 1, 2011

(54) TEST MODE SIGNAL GENERATOR FOR SEMICONDUCTOR MEMORY AND METHOD OF GENERATING TEST MODE SIGNALS

(75) Inventor: Ki Up Kim, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 205 days.

(21) Appl. No.: 12/345,889

(22) Filed: Dec. 30, 2008

(65) Prior Publication Data

US 2010/0074031 A1    Mar. 25, 2010

(30) Foreign Application Priority Data

Sep. 19, 2008    (KR) ...................... 10-2008-0092208

(51) Int. Cl.
*G11C 29/00*    (2006.01)

(52) U.S. Cl. .............. 365/201; 365/230.06; 365/230.08

(58) Field of Classification Search ................. 365/201, 365/189.05, 189.12, 230.06, 230.08
See application file for complete search history.

(56) References Cited

U.S. PATENT DOCUMENTS

| | | | |
|---|---|---|---|
| 6,269,038 B1 * | 7/2001 | Itou et al. .................. | 365/201 |
| 6,950,357 B2 * | 9/2005 | Do .............................. | 365/201 |
| 7,107,500 B2 * | 9/2006 | Jang ........................... | 714/718 |
| 7,184,340 B2 * | 2/2007 | Lim ............................ | 365/201 |
| 2009/0070061 A1 * | 3/2009 | Cha ........................... | 702/120 |

FOREIGN PATENT DOCUMENTS

| | | |
|---|---|---|
| KR | 1020040003562 A | 1/2004 |
| KR | 1020040056786 A | 7/2004 |
| KR | 1020060129756 A | 12/2006 |

* cited by examiner

*Primary Examiner*—Tuan T Nguyen
*Assistant Examiner*—Toan Le
(74) *Attorney, Agent, or Firm*—Ladas & Parry LLP

(57) ABSTRACT

A test mode signal generator for a semiconductor memory device includes a test mode entry control unit that receives test entry mode setting addresses inputted in response to a test mode register set signal. The test mode entry control unit outputs a plurality of test entry mode signals and a test mode set signal according to the test entry mode setting addresses. A latch unit latches test address decoding signals in response to the test mode set signal, and outputs test mode signals by allowing the latched test address decoding signals to be controlled by the respective test entry mode signals. A test mode signal is generated for each test entry mode, so that the number of test modes is increased without increasing the number of addresses for supporting test modes.

28 Claims, 13 Drawing Sheets

TEST MODE SIGNAL GENERATOR FOR SEMICONDUCTOR MEMORY AND METHOD OF GENERATING TEST MODE SIGNALS

CROSS-REFERENCE TO RELATED APPLICATIONS

The present application claims priority to Korean patent application number 10-2008-0092208 filed on Sep. 19, 2008, which is incorporated herein by reference in its entirety.

BACKGROUND OF THE INVENTION

The present invention relates generally to semiconductor memory, and more particularly to a test mode signal generator for a semiconductor memory device and a method of generating test mode signals.

A typical semiconductor memory device includes separate test circuits for testing the device in addition to the circuit unit that performs the primary functions of the semiconductor memory device. In a typical semiconductor device, testing is performed by inputting separate distinct test signals different from the general operation signals.

In order to improve test efficiency, a semiconductor memory will utilize various types of test modes (e.g., a test mode for voltage control and a test mode for data compression) and will include a test mode signal generator that generates signals for entering a specific test mode of these various test modes or for causing the entered test mode to be deactivated.

Generally, in a test mode signal generator, when a total of eleven addresses are inputted to a semiconductor memory, an address A<7> of the eleven addresses A<0:10> is used to generate a test mode register set signal TMRS together with a mode register set signal MRS, and addresses A<8:10> are used to generate a test mode set signal TMSET for informing of a test mode entry together with the test mode register set signal TMRS. The other addresses A<0:6> are used to code various test modes.

Referring to FIG. 1, a conventional test mode signal generator generates a test mode set signal TMSET which causes the semiconductor memory device to enter into a test mode. Additionally, the test mode signal generator generates a test mode signal TM (not shown) so that the semiconductor device performs a specific test designated by the test mode signal TM when the semiconductor memory enters the test mode.

In a conventional test mode signal generator, a test mode register set signal TMRS is inputted during three cycles in order to prevent the semiconductor memory from unintentionally entering into a test mode when noise or the like influences the device. A conventional test mode signal generator will activate the test mode set signal TMSET and output the activated test mode set signal TMSET when addresses A<8:10> corresponding to specific values known as predetermined test entry codes <H, H, L>, <L, H, H>, <H, L, L> are sequentially inputted during the respective cycles.

Further, a conventional test mode signal generator generates 128 test mode signals TM by decoding addresses A<0:6> and outputs a decoding signal as a test mode signal TM in response to the test mode set signal TMSET. The decoding signal is activated by decoding the addresses A<0:6> received during the respective cycles of the test mode register set signal TMRS for activating the test mode set signal TMSET.

In more detail, a conventional test mode signal generator includes latch circuits that latch 128 decoding signals for allowing the addresses A<0:6> to be decoded by the test mode set signal TMSET, and the conventional test mode signal generator generates a maximum of 128 test mode signals TM.

However, the complicated operations in a semiconductor memory device may require an increase in the number of test modes. In a conventional test mode signal generator, when the number of required test modes increases, the number of addresses necessary for supporting the increased number of test modes also increases.

Further, a latch circuit for latching an increased number of decoding signals will be necessary, and as a consequence the chip size increases.

SUMMARY OF THE INVENTION

The present invention provides a test mode signal generator which increases the number of test modes without increasing the number of addresses for supporting test modes.

The present invention also provides a test mode signal generator which increases the number of test modes without increasing the chip size.

The present invention also provides a method of generating test mode signals, which increases the number of test modes without increasing the number of addresses for supporting test modes.

According to an aspect of the present invention, there is provided a test mode signal generator for a semiconductor memory, which includes a test mode entry control unit receiving a plurality of test entry mode setting addresses in response to a test mode register set signal, and outputting a plurality of test entry mode signals and a test mode set signal according to the test entry mode setting addresses; and a latch unit latching a plurality of test address decoding signals in response to the test mode set signal, and outputting a plurality of test mode signals each corresponding to any one of the test entry mode signals, wherein the respective latched signals are controlled by the test entry mode signals to output as the test mode signals.

The test mode signal generator may further comprising a test mode register set signal generation unit receiving a mode register set signal and a test determination address. The test mode register set signal may be generated according to the mode register set signal and the test determination address to set a test mode register.

The test address decoding signals may be generated by decoding a plurality of test mode setting addresses.

The test mode entry control unit may include an address shift unit shifting the test entry mode setting addresses, which are sequentially inputted in synchronization with the test mode register set signal, and outputting a plurality of shift addresses; and a test mode entry control signal generation unit coding the shift addresses, wherein the test mode entry control signal generation unit outputs the test entry mode signals as the coded result, and outputs the test mode set signal according to the test entry mode signals.

The test mode entry control signal generation unit may include a coding unit coding the shift addresses and outputting the test entry mode signals as the coded result, wherein the respective test entry mode signals are activated corresponding to coding logic of the coding unit and the shift addresses; and a test mode set signal generation unit activating the test mode set signal and outputting the activated test mode set signal when at least one of the test entry mode signals is activated.

The number of test mode signals outputted by the test mode latch unit may be in proportion to the number of test address decoding signals and the number of test entry mode signals.

According to another aspect of the present invention, there is provided a test mode signal generator for a semiconductor memory, which includes a test entry mode setting unit receiving a plurality of test entry mode setting addresses in response to a test mode register set signal and coding the test entry mode setting addresses to output a plurality of test entry mode signals; a test mode set signal generation unit outputting a test mode set signal according to the test entry mode signals; a test address decoding unit receiving a plurality of test mode setting addresses in response to the test mode register set signal, and decoding the test mode setting addresses to output a plurality of test address decoding signals; a latch unit latching the respective test address decoding signals in response to the test mode set signal to output a plurality of latch signals; and a test mode signal output unit outputting a plurality of test mode signals each corresponding to any one of the test entry mode signals, wherein the respective latch signals are controlled by the test entry mode signals to output as the test mode signals.

The test mode register set signal may generate according to a received mode register set signal and test determination address, wherein the test mode register set signal is activated to set a test mode register when a mode register set signal and the test determination address are each activated.

The test entry mode setting unit may include an address shift unit shifting the test entry mode setting addresses sequentially inputted in synchronization with the test mode register set signal and outputting a plurality of shift addresses; and a plurality of coding units each coding any one of the shift addresses such that the test mode signals is output from the coding units.

The test mode set signal generation unit may activate the test mode set signal and output the activated test mode set signal when at least one of the test entry mode signals is activated.

The test mode signal output unit may include a plurality of output units each corresponding to any one of the latch signals and each outputting the test mode signals corresponding to the output unit, wherein the corresponding latch signal of each output unit is controlled by the test entry mode signals to output the test mode signals corresponding to the output unit.

The number of the test mode signals outputted by the test mode signal output unit may be in proportion to the number of latch signals and the number of test entry mode signals.

According to still another aspect of the present invention, there is provided a test mode signal generator for a semiconductor memory, which includes a test mode control unit receiving a plurality of test entry mode setting addresses and a plurality of test mode setting addresses in response to a mode register set signal and a test determination address, and outputting a test mode set signal, a plurality of test entry mode signals and a plurality of test address decoding signals; and a test mode latch unit latching the test address decoding signals in response to the test mode set signal, and outputting the latched signals as a plurality of test mode signals, wherein the respective latched signals are controlled by the test entry mode signals to output as the test mode signals.

The test mode control unit may include a test mode register set signal generation unit outputting a test mode register set signal for determining whether or not a test is performed in response to the mode register set signal and the test determination address; a test mode entry control unit receiving the test entry mode setting addresses in response to the test mode register set signal and coding the test entry mode setting addresses to output the test entry mode signals and the test mode set signal; and a test address decoding unit decoding the test mode setting addresses in response to the test mode register set signal to output the test address decoding signals.

The test mode register set signal generation unit may activate the test mode register set signal and output the activated test mode register set signal when each of the mode register set signal and the test determination signal are activated.

The test mode register set signal generation unit may output a reset signal for ending the test when the mode register set signal is activated in a state in which the test determination address is deactivated.

The test mode entry control unit may include an address shift unit shifting the test entry mode setting addresses sequentially inputted in response to the test mode register set signal to output a plurality of shift addresses; a test entry mode signal generation unit coding the shift addresses to output the test entry mode signals; and a test mode set signal generation unit outputting the test mode set signal in response to the test entry mode signals.

The test mode latch unit may include a latch unit latching the test address decoding signals in response to the test mode set signal; and an output unit outputting the test mode signals each corresponding to any one of the test entry mode signals, wherein the respective latched signals are controlled by the test entry mode signals to output as the test mode signals.

According to still another aspect of the present invention, there is provided a method of generating test mode signals for a semiconductor memory, which includes shifting a plurality of test entry mode setting addresses sequentially inputted in response to a test mode register set signal to generate a plurality of shift addresses; coding the shift addresses to output a plurality of test entry mode signals; outputting a test mode set signal activated when at least one of the test entry mode signals is activated; and outputting test address decoding signals and latching the test address decoding signals in response to the test mode set signal; and outputting a plurality of test mode signals each corresponding to any one of the entry mode signals, wherein the test mode signals are output according to the test entry mode signals and the latched test address decoding signals.

The test mode register set signal may be generated in response to a mode register set signal and a test determination address to set a test mode register. The test address decoding signals may be signals having test information and be obtained by decoding a plurality of test mode setting addresses that are decoded in response to the test mode register set signal.

The number of test mode signals may be in proportion to the number of test entry mode signals and the number of test address decoding signals.

According to still another aspect of the present invention, there is provided a method of generating test mode signals for a semiconductor memory, which includes receiving a plurality of test entry mode setting addresses inputted in response to a test mode register set signal; outputting a plurality of test entry mode signals and a test mode set signal according to the test entry mode setting addresses; latching a plurality of test address decoding signals in response to the test mode set signal; and outputting a plurality of test mode signals each corresponding to any one of the test entry mode signals, wherein the latched test address decoding signals are controlled by the test entry mode signals to output as the test mode signals.

The test mode register set signal may be generated in response to a mode register set signal and a test determination address to set a test mode register. The test address decoding signals may be signals generated by decoding a plurality of test mode setting addresses.

The test entry mode setting addresses may shift to output a plurality of shift addresses, and code the shift addresses using a plurality of coding logic to output the test entry mode signals, wherein the test entry mode setting addresses are sequentially inputted in response to the test mode register set signal in order to shift the test entry mode setting addresses.

The test mode set signal may be activated when at least one of the test entry mode signals is activated.

The number of test mode signals may be in proportion to the number of test entry mode signals and the number of test address decoding signals.

According to the present invention, in a test mode signal generator, a plurality of test entry modes are set, and a test mode signal is generated for each of the test entry modes, so that the number of test modes can be increased without increasing the number of addresses for supporting the test modes.

Further, in a test mode signal generator, a plurality of test entry modes are set, and a test mode signal is generated for each of the test entry modes, so that the number of test modes can be increased without increasing a chip size.

Furthermore, in a method of generating test mode signals, a plurality of test entry modes are set, and a test mode signal is generated for each of the test entry modes, so that the number of test modes can be increased without increasing a chip size.

DESCRIPTION OF SPECIFIC EMBODIMENTS

Hereinafter, preferred embodiments of the present invention will be described in detail with reference to the accompanying drawings.

The present invention provides a test mode signal generator and a method of generating test mode signals, in which a plurality of test entry modes are set, and a test mode signal is generated for each of the test entry modes, and thereby the number of test modes are increased without increasing the chip size.

A test mode signal generator for a semiconductor device according to a first embodiment of the present invention will be described with reference to FIG. 2.

Figure 1:
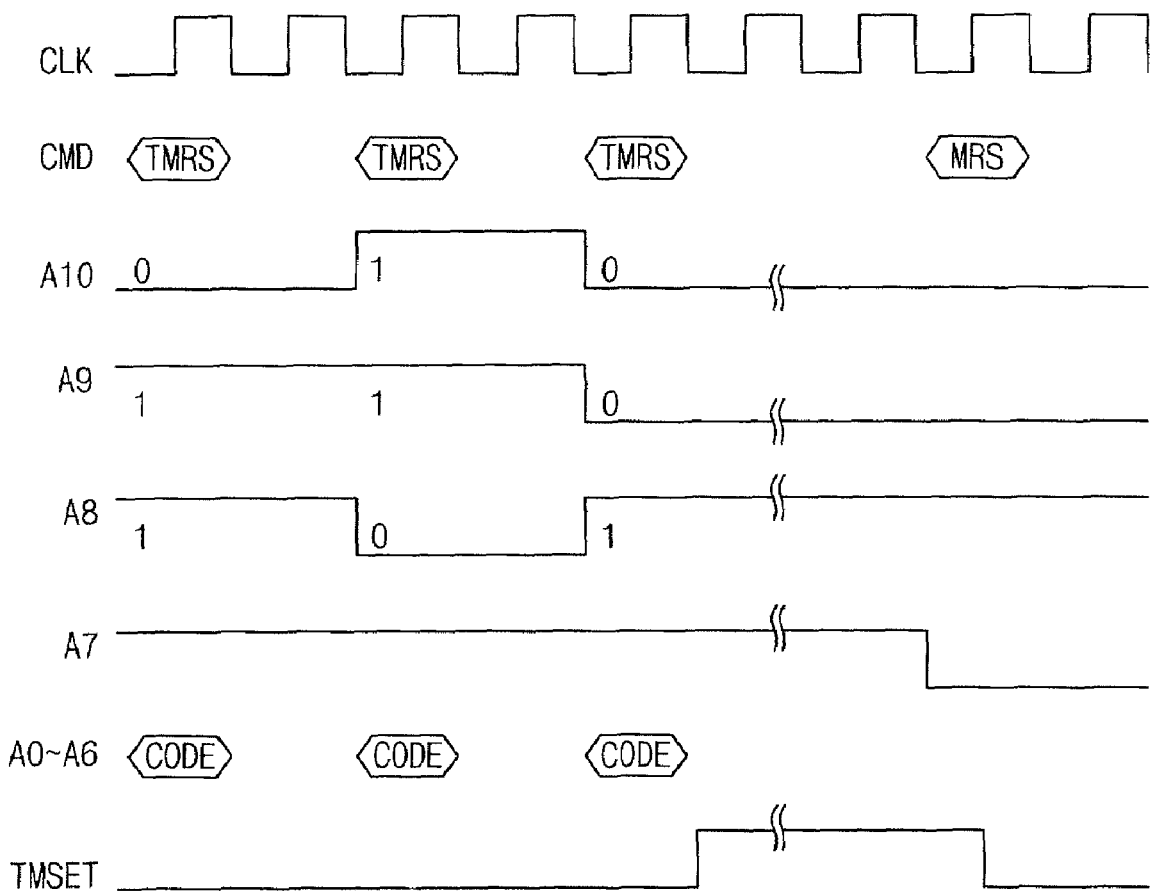
FIG. 1 is a waveform diagram shown for illustrating the operation of a test mode signal generator for a conventional semiconductor memory device.
Figure 2:
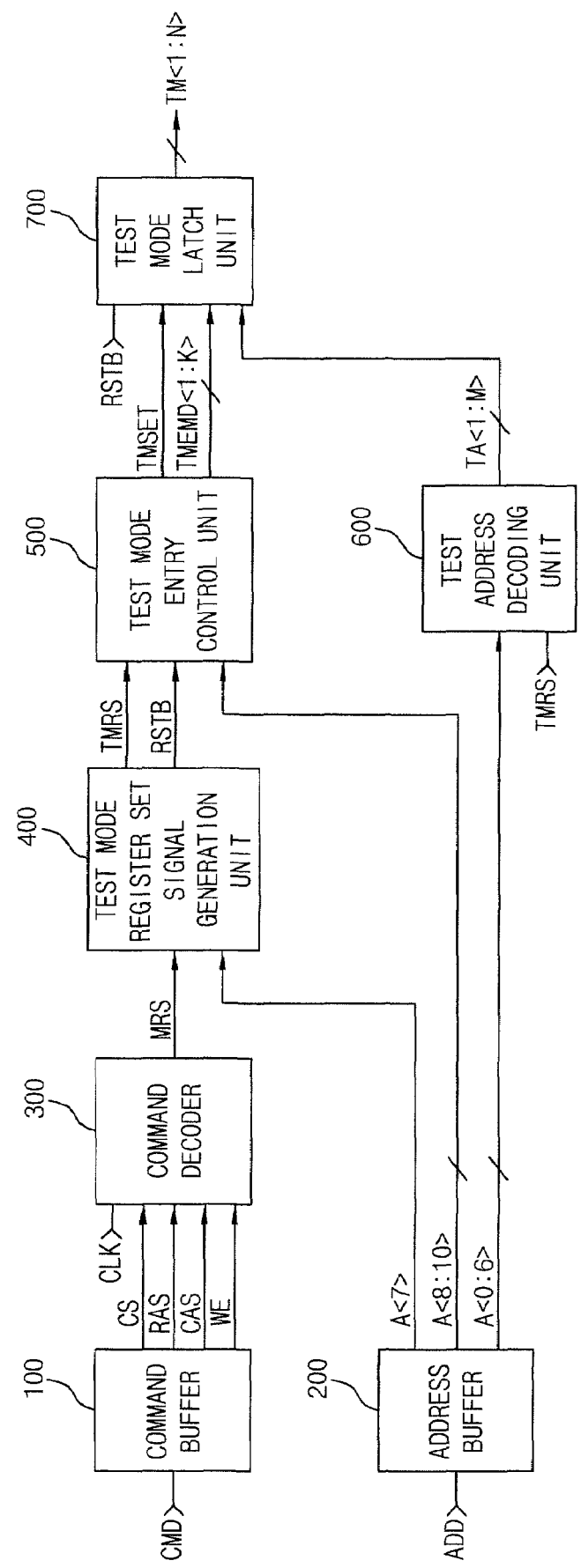
FIG. 2 is a block diagram showing a test mode signal generator for a semiconductor memory device according to a first embodiment of the present invention.

As shown in FIG. 2, the test mode signal generator for the semiconductor device according to an embodiment of the present invention includes a command buffer 100, an address buffer 200, a command decoder 300, a test mode register set signal generation unit 400, a test mode entry control unit 500, a test address decoding unit 600, and a test mode latch unit 700.

The command buffer 100 receives a command CMD inputted from the outside (i.e., for example, outside the test mode signal generator), and the command buffer 100 buffers and latches the received command CMD. The address buffer 200 receives an address ADD inputted from the outside, and buffers and latches the received address ADD.

The command decoder 300 outputs a mode register set signal MRS in response to a clock signal CLK and internal commands (e.g., CS, RAS, CAS, WE) outputted from the command buffer 100. The mode register set signal MRS is a signal for setting a mode register to set a general operation mode of the semiconductor memory.

The test mode register set signal generation unit 400 outputs a test mode register set signal TMRS and a reset signal RSTB in response to both the mode register set signal MRS outputted from the command decoder 300 and specific address A<7> (hereinafter, referred to as a "test determination address") outputted from the address buffer 200.

The test mode entry control unit 500 outputs a test mode set signal TMSET and test entry mode signals TMEMD<1:K> in response to the test mode register set signal TMRS outputted from the test mode register set signal generation unit 400 and specific addresses A<8:10> (hereinafter, referred to as "test entry mode setting addresses") outputted from the address buffer 220. The test mode entry control unit 500 is reset in response to the reset signal RSTB outputted from the test mode register set signal generation unit 400. Here, K in TMEND<1:K> is a natural number corresponding to the number of test entry mode signals.

The test address decoding unit 600 decodes the specific addresses A<0:6> (hereinafter, referred to as "test mode setting addresses") outputted from the address buffer 200. The test address decoding unit 600 decodes the test mode setting addresses in response to the test mode register set signal TMRS outputted from the test mode register set signal generation unit 400 to output test address decoding signals TA<1:M>. Here, M in TA<1:M> is a natural number corresponding to the number of test address decoding signals.

The test mode latch unit 700 latches the respective test address decoding signals TA<1:M> outputted from the test address decoding unit 600 in response to the test mode set signal TMSET outputted from the test mode entry control unit 500, and the test mode latch unit 700 outputs test mode signals TM<1:N> by controlling the latched signals with the respective test entry mode signals TEMD<1:K>. Here, N in TM<1:N> is a natural number corresponding to K*M.

The test mode signal generator for the semiconductor device according to an embodiment of the present invention will be described in greater detail with reference to FIGS. 3 to 8.

Figure 3:
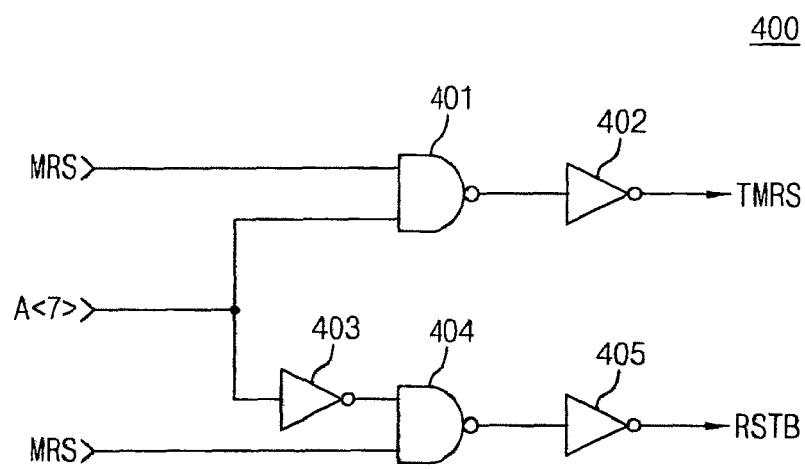
FIG. 3 is a detailed circuit diagram showing the test mode register set signal generation unit shown in FIG. 2.

FIG. 3 is a detailed circuit diagram showing the test mode register set signal generation unit 400 shown in FIG. 2.

Referring to FIG. 3, the test mode register set signal generation unit 400 includes NAND gates 401, 404 and inverters 402, 403, 405. As described above, the test mode register set signal generation unit 400 outputs a test mode register set signal TMRS and a reset signal RSTB in response to a mode register set signal MRS and an a test determination address. The test mode register set signal TMRS is for setting a mode register to perform a test, and the reset signal RSTB is for ending test performance.

Specifically, the NAND gate 401 receives and performs a NAND logical operation on the mode register set signal MRS and the address A<7> (i.e., the test determination address), and the inverter 402 inverts the output of the NAND gate 401 and outputs the test mode register set signal TMRS. The inverter 403 receives and inverts the address A<7>, and the NAND gate 404 receives and performs a NAND logical operation on the output of the inverter 403 and the mode register set signal MRS. The inverter 405 inverts the output of the NAND gate 404 and outputs the reset signal RSTB.

Therefore, when both of the mode register set signal MRS and the test determination address A<7> are activated as high levels, the test mode register set signal generation unit 400 activates the test mode register set signal TMRS and outputs the activated test mode register set signal TMRS. When the mode register set signal MRS is activated as a high level and the test determination address A<7> is deactivated as a low level, the test mode register set signal generation unit 400 activates the reset signal RSTB and outputs the activated reset signal RSTB.

Figure 4:
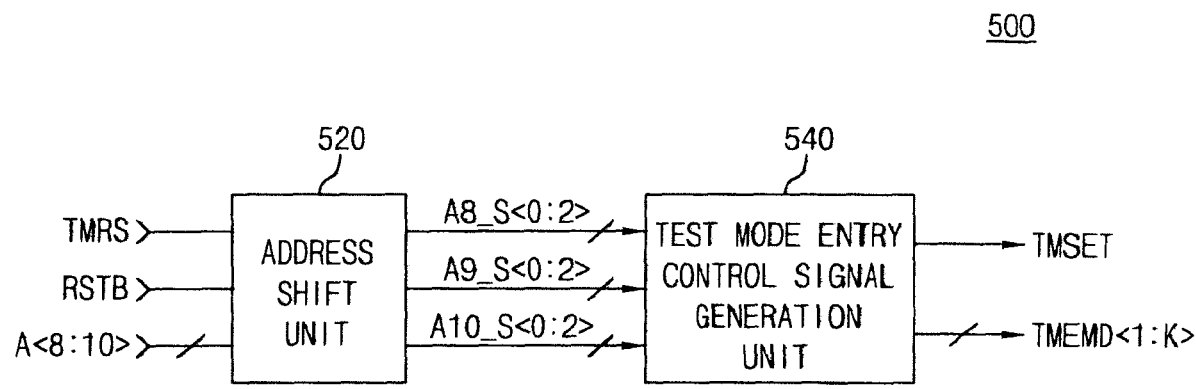
FIG. 4 is a detailed block diagram showing the test mode entry control unit shown in FIG. 2.

FIG. 4 is a detailed block diagram showing the test mode entry control unit 500 shown in FIG. 2.

Referring to FIG. 4, the test mode entry control unit 500 includes an address shift unit 520 and a test mode entry control signal generation unit 540. As described above, the test mode entry control unit 500 outputs test entry mode signals TMEMD<1:K> and a test mode set signal TMSET. The test entry mode signals are for selecting any one of a plurality of test entry modes, and the test mode set signal TMSET is for entering into a test mode.

The address shift unit 520 shifts the test entry mode setting addresses A<8:10> received from the address buffer 200 into three steps in response to the test mode register set signal TMRS output from the test mode register set signal generation unit 400; and thereby, the address shift unit 520 outputs shifted shift addresses A8_S<0:2>, A9_S<0:2>, A10_S<0:2>. The address shift unit 520 is reset in response to the reset signal RSTB received from the test mode register set signal generation unit 400.

The test mode entry control signal generation unit 540 receives the shift addresses A8_S<0:2>, A9_S<0:2>, A10_S<0:2> outputted from the address shift unit 520, and outputs the test entry mode signals TMED<1:K> by coding the shift addresses using a plurality of coding logic. The test mode entry control signal generation unit 540 outputs the test mode set signal TMSET in response to the test entry mode signals TMEMD<1:K>.

Figure 5:
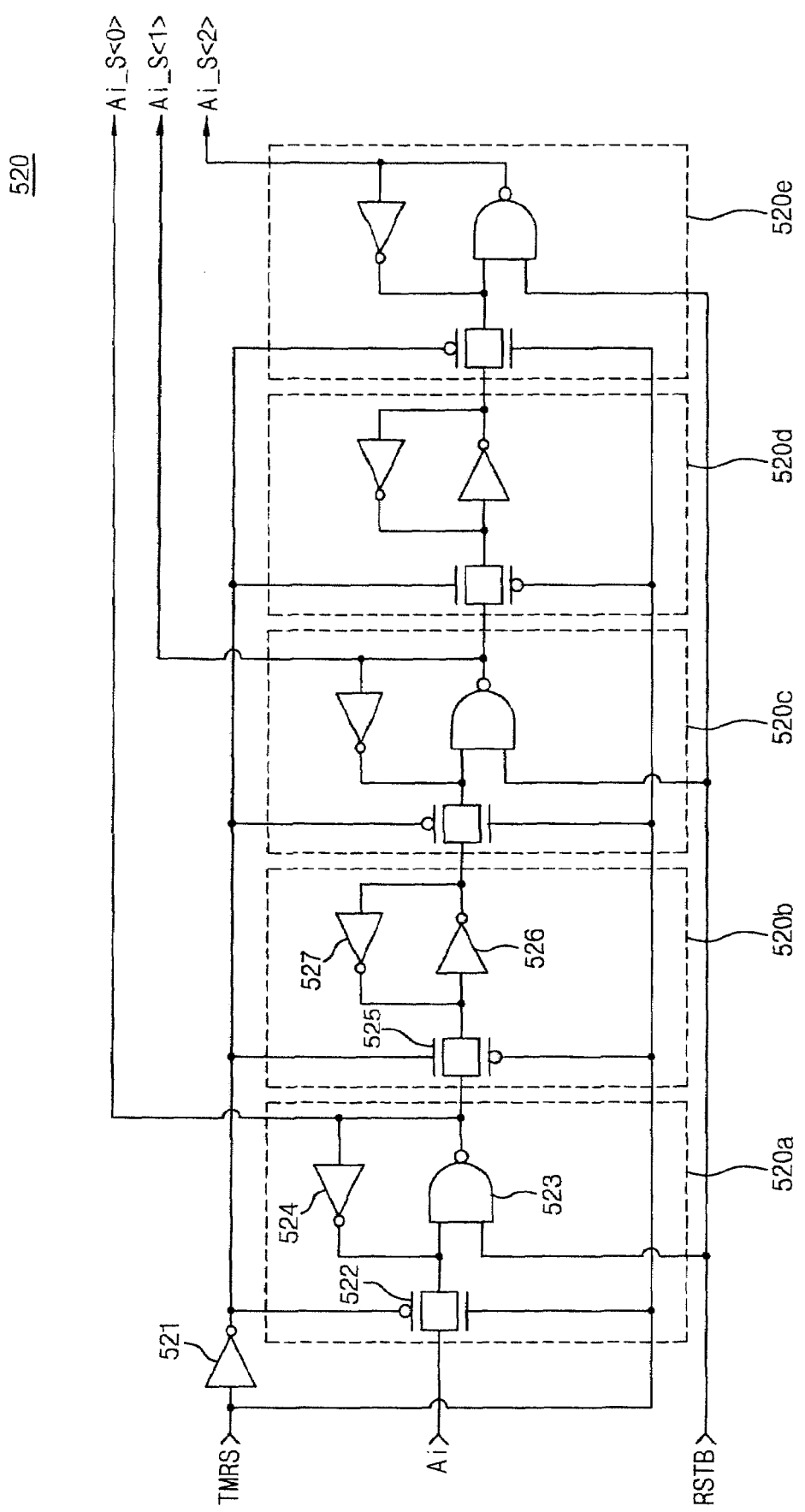
FIG. 5 is a detailed circuit diagram showing a shift register unit of the address shift unit shown in FIG. 4.

FIG. 5 is a detailed circuit diagram showing one of a plurality of shift register units included in the address shift unit 520.

Referring to FIG. 5, the address shift unit 520 includes a plurality of shift register units, and each of the shift register units includes an inverter 521 and a plurality of latches 520a to 520e. A shift register unit of the address shift unit 520 shifts any one Ai of the test entry mode setting addresses A<8:10> into three steps in response to a test mode register set signal TMRS to output shift addresses Ai_S<0:2> (i.e., the shifting occurs during three cycles of the test mode register set signal TMRS). The address shift unit 520 initializes the shift addresses Ai_S<0:2> in response to the reset signal RSTB.

Specifically, the inverter 521 inverts the test mode register set signal TMRS and outputs the inverted test mode register set signal.

The latch 520a includes a pass gate 522, a NAND gate 523 and an inverter 524. The pass gate 522 provides a test entry mode setting address Ai of the test entry mode setting addresses A<8:10> when the test mode register set signal TMRS is at a high level. The NAND gate 523 receives the signal provided by the pass gate 522 and the reset signal RSTB and outputs a shift address Ai_S<0>. The inverter 524 inverts the output of the NAND gate 523 and the inverted output of the inverter 524 is fed back to an input of the NAND gate 523, thereby latching the shift address Ai_S<0>.

The configuration of each of the latches 520c, 520e shown in FIG. 5 is identical to that of the latch 520a. Therefore, additional descriptions of the configuration of latches 520c, 520e will be omitted.

The latch 520b includes a pass gate 525 and inverters 526, 527. The pass gate 525 provides the signal outputted from the previous latch 520a in response to a low level of the test mode register set signal TMRS. The inverter 526 inverts the signal provided from the pass gate 525. The inverter 527 inverts the output of the inverter 526, and the inverted output of the inverter 527 is fed back to the input of the inverter 526, thereby latching the output of the inverter 526.

The configuration of the latch 520d is identical to that of the latch 520b shown in FIG. 5. Therefore, an additional description of the configuration of latch 520d will be omitted.

Thus, the respective latches 520a, 520c, 520e shift and latch the test entry mode setting address Ai or the signal outputted from the previous latch sequentially in response to respective high levels of the test mode register set signal TMRS, which is toggled during three cycles to shift the test entry mode setting addresses Ai into three steps. Each of the latches 520a, 520c, 520e outputs its latched signal as a corresponding one of the shift addresses Ai_S<0:2>. Also, the latches 520a, 520c, 520e initialize the shift addresses Ai_S<0:2> in response to the reset signal RSTB. Each of the latches 520b, 520d inverts the output of the previous latch, and the latches 520b, 520d latch the inverted outputs sequentially in response to low levels of the test mode register set signal TMRS (that is, the latch 520b will output the inverted output of the latch 520a in response to a low level when the test mode register set signal TMRS is toggled, and the latch 520d will output the inverted output of the latch 520c in response to another low level when the TMRS is toggled).

Figure 6:
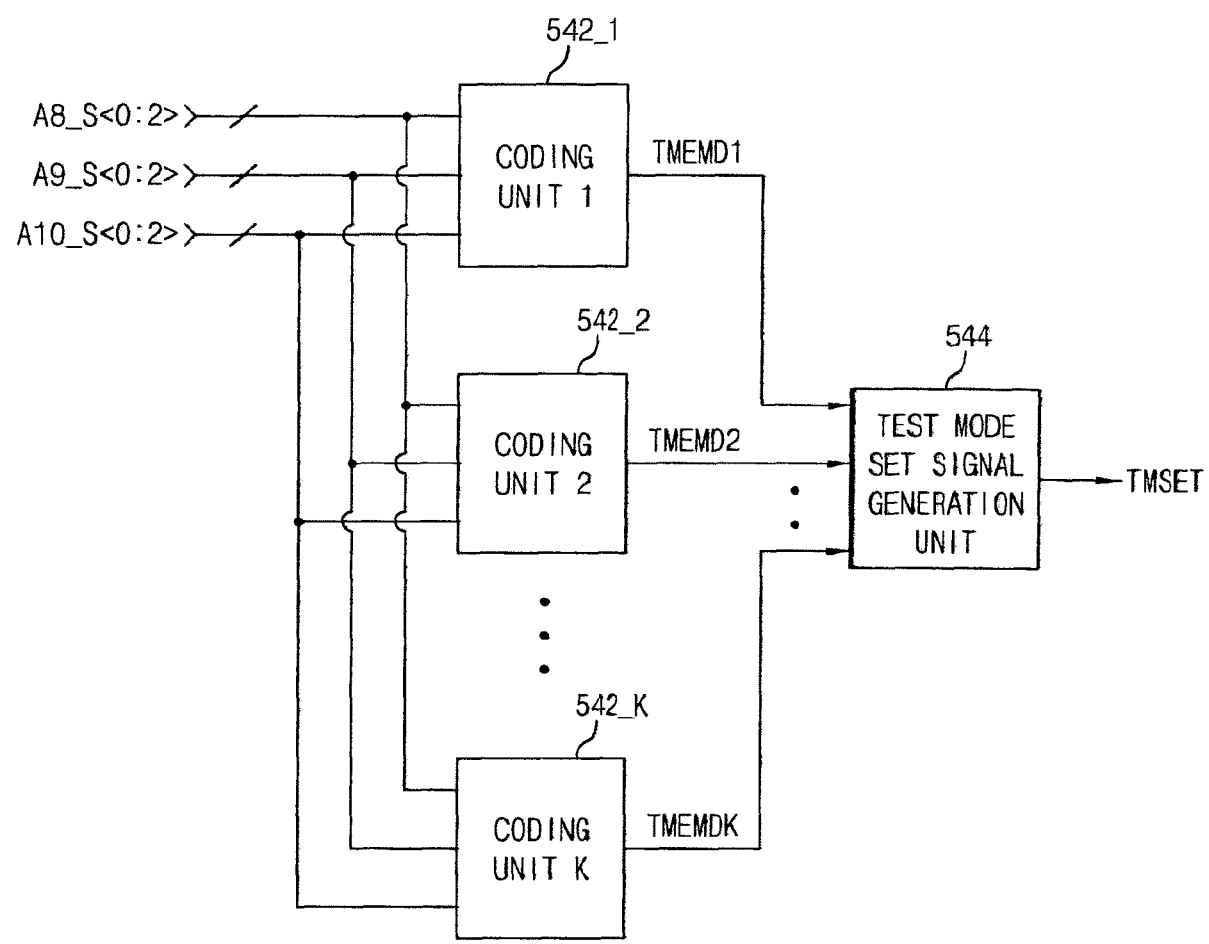
FIG. 6 is a detailed block diagram showing the test mode entry control signal generation unit shown in FIG. 4.

FIG. 6 is a detailed block diagram showing the test mode entry control signal generation unit 540 shown in FIG. 4.

Referring to FIG. 6, the test mode entry control signal generation unit 540 shown in FIG. 4 includes a plurality of coding units 542_1 to 542_K and a test mode set signal generation unit 544. The test mode entry control signal generation unit 540 outputs test entry mode signals TMEMD<1:K> corresponding to the respective coding units 542_1 to 542_K and a test mode set signal TMSET.

The respective coding units 542_1 to 542_K employ different coding logics set by sequential combinations of test entry mode setting addresses A<8:10>. Each of the coding units 542_1 to 542_K codes shift addresses A8_S<0:2>, A9_S<0:2>, A10_S<0:2> and allows any one of test entry mode signals TMEMD<1:K> to be activated and outputted.

For example, a coding logic may be configured so that when the test entry mode setting addresses A<8:10> are sequentially inputted as <H, H, L>, <L, H, H>, <H, L, L> (that is, A<8:10> is input as <H, H, L> in the first cycle, A<8:10> is input as <L, H, H> during the second cycle, and A<8:10> is input as <H, L, L> during the third cycle), the coding unit 542_1 enables an output signal. A coding logic may be configured so that when the test entry mode setting addresses A<8:10> are sequentially inputted as <L, H, H>, <H, H, L>, <L, L, H>, the coding unit 542_2 enables an output signal.

Figure 7:
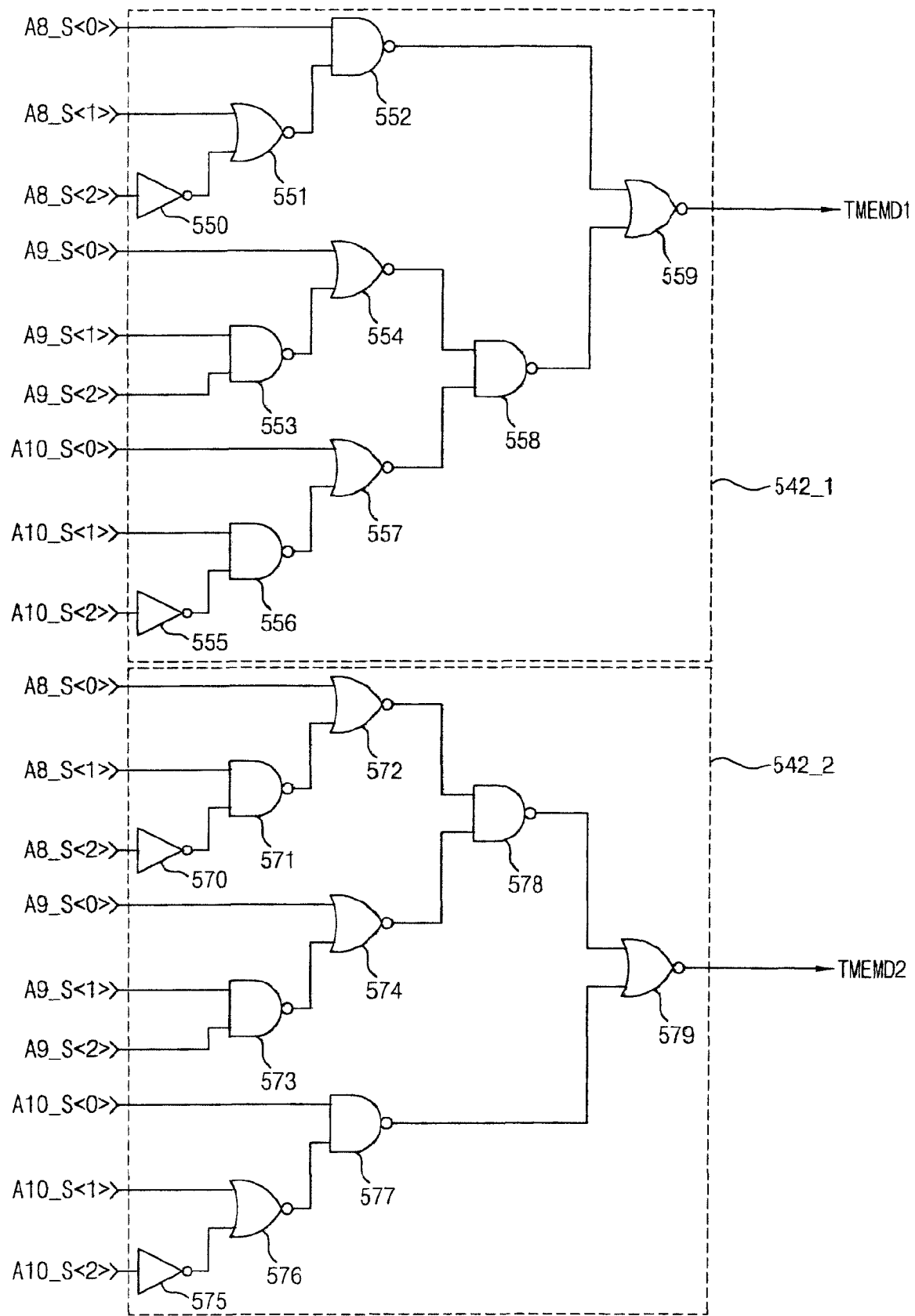
FIG. 7 is a detailed circuit diagram showing an example of the coding unit shown in FIG. 6.

FIG. 7 is a detailed circuit diagram showing examples of specific coding units shown in FIG. 6.

Referring to FIG. 7, the coding unit 542_1 activates the test entry mode signal TMEMD1 and outputs the activated test entry mode signal TMEMD1 when the shift addresses A8_S<0:2>, A9_S<0:2>, A10_S<0:2> are inputted as <H, L, H>, <L, H, H>, <L, H, L>, respectively (i.e., when the test entry mode setting addresses A<8:10> are sequentially inputted to correspond to the set coding logic <H, H, L>, <L, H, H>, <H, L, L>).

To this end, the coding unit 542_1 may include NAND gates 522, 553, 556, 558, NOR gates 551, 554, 557, 559 and inverters 550, 555.

Specifically, in the example shown in FIG. 7, the inverter 550 inverts the shift address A8_S<2>, and the NOR gate 551 receives and performs a NOR logical operation on the output (i.e., the inverted shift address A8_S<2>) of the inverter 550 and the shift address A8_S<1>. The NAND gate 552 receives the output of the NOR gate 551 and the shift address A8_S<0>. The NAND gate 553 receives and performs a NAND logical operation on the shift addresses A9_S<1:2>, and the NOR gate 554 receives the output of the NAND gate 553 and the shift address A9_S<0>. The inverter 555 inverts the shift address A10_S<2>, and the NAND gate 556 receives and performs a NAND logical operation on the output of the inverter 555 and the shift address A10_S<1>. The NOR gate 557 receives and performs a NOR logical operation on the output of the NAND gate 556 and the shift address A10_S<0>. The NAND gate 558 receives and performs a NAND logical operation on the outputs of the NOR gates 554, 557. The NOR gate 559 receives and performs a NOR logical operation on the outputs of the NAND gates 552, 558 and thereby outputs the test entry mode signal TMEMD1. Thus, one can see that when shift addresses A8_S<0:2>, A9_S<0:2>, A10_S<0:2> are inputted as <H, L, H>, <L, H, H>, <L, H, L>, respectively; the test entry mode signal TMEMD1 will be activated and output at a high level.

The coding unit 542_2 activates the test entry mode signal TMEMD2 and outputs the activated test entry mode signal TMEMD2 when the shift addresses A8_S<0:2>, A9_S<0:2>, A10_S<0:2> are inputted as <L, H, L>, <L, H, H>, <H, L, H>, respectively (i.e., when the test entry mode setting addresses A<8:10> are sequentially inputted to correspond to the set coding logic <L, H, H>, <H, H, L>, <L, L, H>).

To this end, the coding unit 542_2 may includes NAND gates 571, 573, 577, 578, NOR gates 572, 574, 576, 579 and inverters 570, 575.

Specifically, in the example shown in FIG. 7, the inverter 570 inverts the shift address A8_S<2>, and the NAND gate 571 receives and performs a NAND logical operation on the output of the inverter 570 and the shift address A8_S<1>. The NOR gate 572 receives and performs a NOR logical operation on the output of the NAND gate 571 and the shift address A8_S<0>. The NAND gate 573 receives and performs a NAND logical operation on the shift addresses A9_S<1:2>, and the NOR gate 574 receives and performs a NOR logical operation on the output of the NAND gate 573 and the shift address A9_S<0>. The inverter 575 inverts the shift address A10_S<2>, and the NOR gate 576 receives and performs a NOR logical operation on the output of the inverter 575 and the shift address A10_S<1>. The NAND gate 577 receives and performs a NAND logical operation on the output of the NOR gate 576 and the shift address A10_S<0>. The NAND gate 578 receives and performs a NAND logical operation on the outputs of the NOR gates 572, 574. The NOR gate 579 receives and performs a NOR logical operation on the outputs of the NAND gates 577, 578 and thereby outputs the test entry mode signal TMEMD2. Thus, one can see that when shift addresses A8_S<0:2>, A9_S<0:2>, A10_S<0:2> are inputted as <L, H, L>, <L, H, H>, <H, L, H>, respectively; the test entry mode signal TMEMD2 will be activated and output at a high level.

Referring again to FIG. 6, when at least one of the test entry mode signals TMEMD<1:K> is activated, the test mode set signal generation unit 544 activates the test mode set signal TMSET and outputs the activated test mode set signal TMSET.

Figure 8:
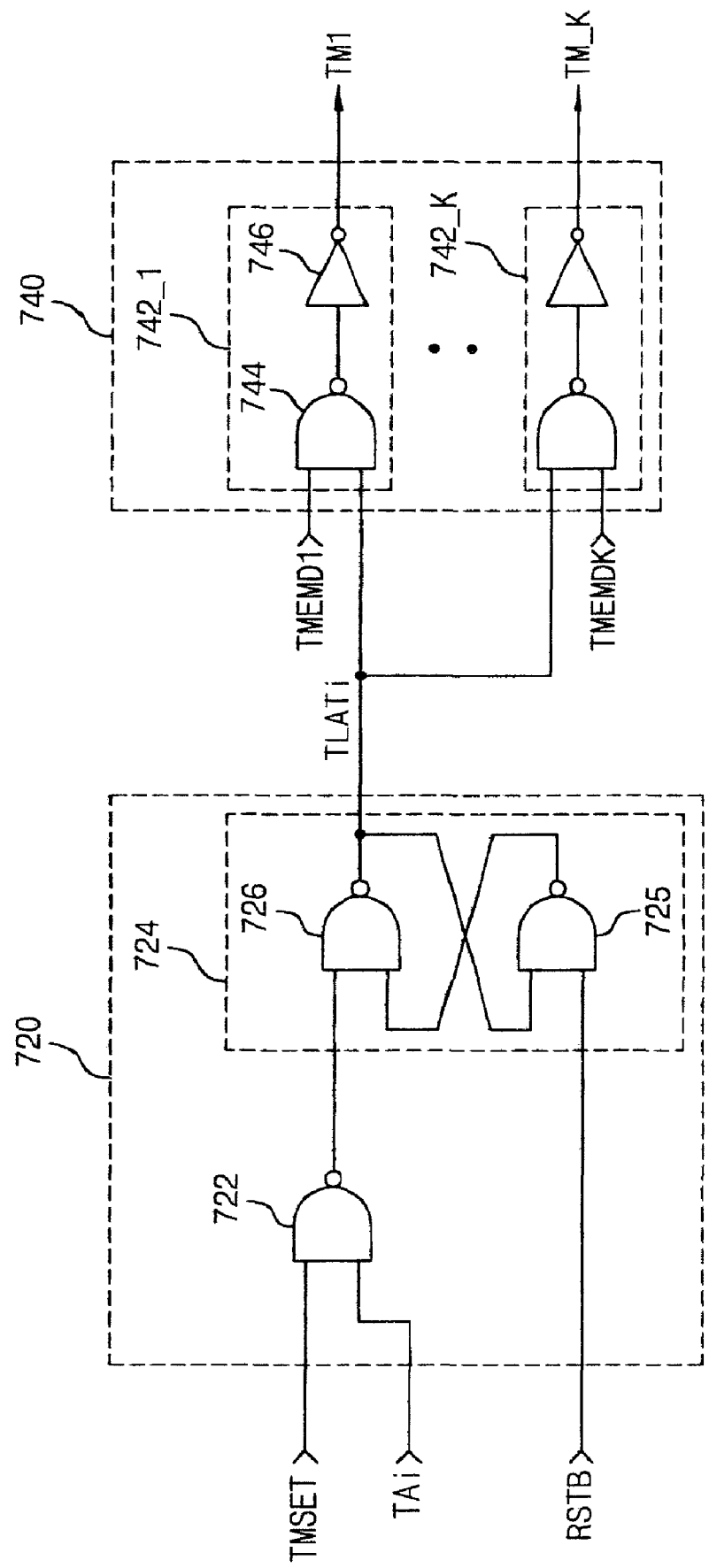
FIG. 8 is a partial detailed circuit diagram showing the test mode latch unit shown in FIG. 2.

FIG. 8 is a partial detailed circuit diagram showing the test mode latch unit shown in FIG. 2

Referring to FIG. 8, the test mode latch unit 700 includes a plurality of latch circuits, and each of the latch circuits includes a latch unit 720 and an output unit 740. A latch circuit of the test mode latch unit 700 latches any one test address decoding signal TAi of the test address decoding signals TA<1:M> in response to a test mode set signal TMSET, and the latched signal TLATi is controlled according to respective test entry mode signals TMEMD<1:K>, to thereby output test mode signals TM<1:K>. As such, a latched signal TAi is inputted to each of a plurality of output units 740, and each of the test mode signals TM<1:K> corresponds to one of the test entry mode signals TMEMD<1:K> (i.e., a test mode signal is generated for each of the test entry modes). Thus, in any one of the output units 740, each of the plurality of test mode signals TM<1:K> is generated according to the corresponding test entry mode signal and the latched signal Tai input to the output unit 740.

The latch unit 720 includes a NAND gate 722 and a latch 724. The NAND gate 722 receives and performs a NAND logical operation on the test mode set signal TMSET and a test address decoding signal TAi. The latch 724 includes NAND gates 725, 726. The NAND gate 725 receives and performs a NAND logical operation on the reset signal RSTB and the output of the NAND gate 726. The NAND gate 726 receives and performs a NAND logical operation on the output of the NAND gate 722 and the output of the NAND gate 725.

As such, the latch unit 720 latches the test address decoding signal TAi in response to the test mode set signal TMSET and is initialized in response to the reset signal RSTB.

The output unit 740 includes a plurality of driving units 742_1 to 742_K. The driving units 742_1 to 742_K output test mode signals TM<1:K>, respectively, by allowing the latched signal TLATi to be controlled by each of the test entry mode signals TMEMD<1:K>.

Each of the driving units 742_1 to 742_K includes a NAND gate 744 and an inverter 746. Each of the NAND gates 744 receives and performs a NAND logical operation on a latched signal TLATi and one of the test entry mode signals TMEMD<1:K>. Each of the inverters 746 inverts the output of the corresponding NAND gate 744 and thereby outputs a corresponding one of the test mode signals TM<1:K>.

The number of latch circuits included in the test mode latch unit 700 corresponds to the number M of the test address decoding signals. Also, the number of test mode signals output from each of the plurality of latch circuits corresponds to the number K of test entry mode signals. Therefore, the total number N of test mode signals corresponds to M*K.

The operation of the test mode signal generator for the semiconductor memory according to embodiments of the present invention described above will now be described with reference to FIG. 9.

A test mode signal generator for a semiconductor memory device according to embodiments the present invention generates a test mode set signal TMSET for allowing the semiconductor memory device to enter into a test mode and generates a test entry mode signal TMEMDi for selecting any one of a plurality of test entry modes. Further, the test mode signal generator for the semiconductor memory according to embodiments of the present invention generates a test mode signal TMi (not shown) for performing a specific test. The test mode signal TMi corresponds to a test entry mode signal when the semiconductor memory has entered into a test mode.

In the test mode signal generator for the semiconductor memory device according to embodiments of the present invention, a test mode register set signal TMRS is inputted during three cycles so as to prevent the semiconductor memory device from inadvertently entering into a test mode due to noise or the like.

In further detail, when test entry mode setting addresses A<8:10>, which correspond to any one of a plurality of coding logics set in respective coding units, are sequentially inputted during each of the cycles, a corresponding test entry mode signal TMEMDi is activated, and any one of the plurality of test entry modes is selected.

Figure 9:
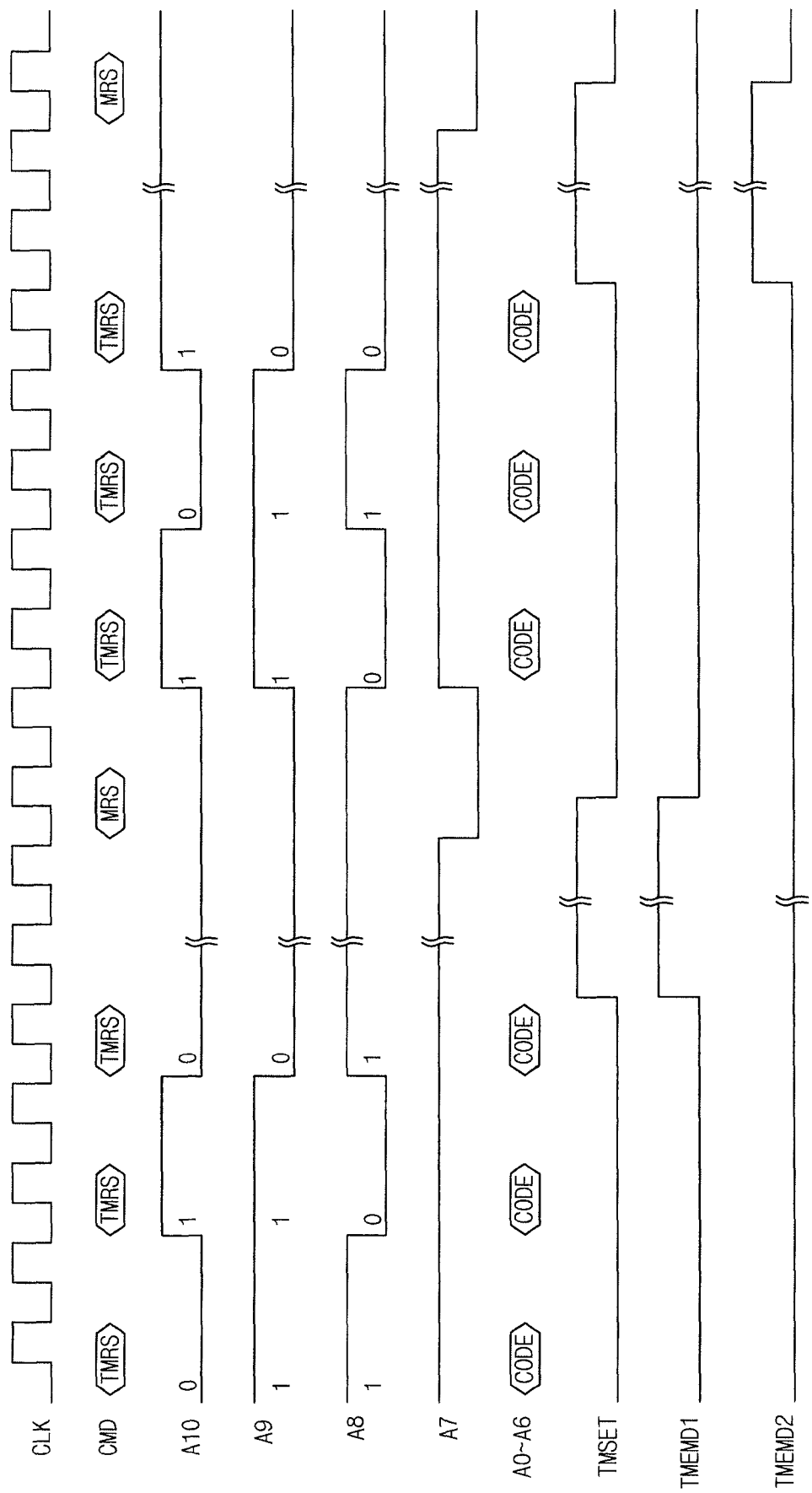
FIG. 9 is a waveform diagram shown for illustrating the operation of a test mode signal generator for a semiconductor memory device according to the present invention.

For example, in FIG. 9, when test entry mode setting addresses A<8:10> are sequentially inputted as <H, H, L>, <L, H, H>, <H, L, L> in the respective cycles of the test mode register set signal TMRS (that is, A<8:10> is input as <H, H, L> in the first cycle, A<8:10> is input as <L, H, H> during the second cycle, and A<8:10> is input as <H, L, L> during the third cycle), a test entry mode signal TMEMD1 is activated by the corresponding coding unit (542_1 of FIG. 7) having the appropriate coding logic, and a first test entry mode corresponding to the test entry mode signal TMEMD1 is selected. As a further example, when the test entry mode setting addresses A<8:10> are sequentially inputted as <L, H, H>, <H, H, L>, <L, L, H>, a test entry mode signal TMEMD2 is activated by the corresponding coding unit (542_2 of FIG. 7), having the appropriate coding logic, and a second test entry mode corresponding to the test entry mode signal TMEMD2 is selected.

When any one test entry mode signal TMEMDi is activated, the test mode signal generator for the semiconductor memory device according to embodiments of the present invention allows the semiconductor memory to enter into a test mode by activating and outputting a test mode set signal TMSET.

Test address decoding signals TA<1:M> (e.g., 128 test address decoding signals) are activated by test mode setting addresses A<0:6> received during a cycle of the test mode register set signal TMRS for activating the test mode set signal TMSET, i.e., during a third cycle. The test address decoding signals TA<1:M> are latched in response to the test mode set signal TMSET. Then, each of the latched signals are controlled by the test entry mode signals TMEMD<1:K>, and a signal latched by an activated test entry mode signal TMEMDi is outputted as a test mode signal, and thereby the semiconductor memory can perform a specific test.

A test mode signal generator for a semiconductor memory device according to another embodiment of the present invention will be described with reference to FIG. 10.

Figure 10:
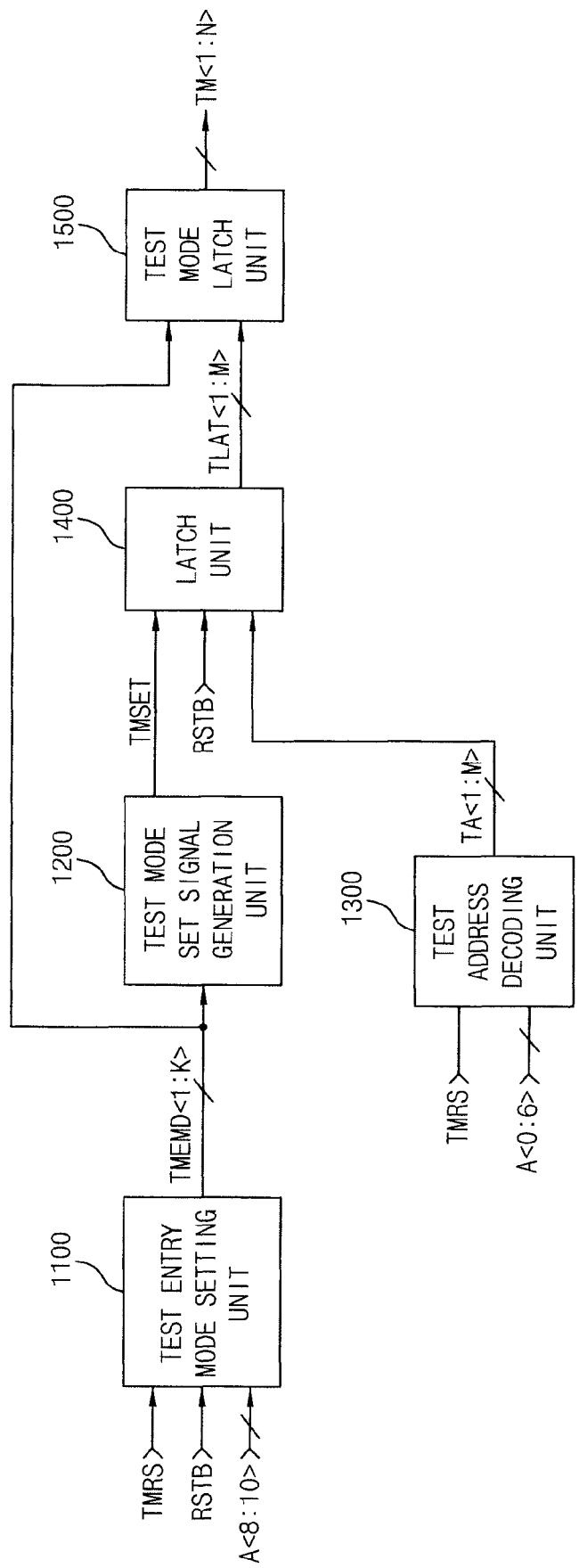
FIG. 10 is a block diagram showing a test mode signal generator for a semiconductor memory device according to another embodiment of the present invention.

As shown in FIG. 10, the test mode signal generator for a semiconductor memory device according to another embodiment of the present invention includes a test entry mode setting unit 1100, a test mode set signal generation unit 1200, a test address decoding unit 1300, a latch unit 1400 and a test mode signal output unit 1500.

Figure 11:
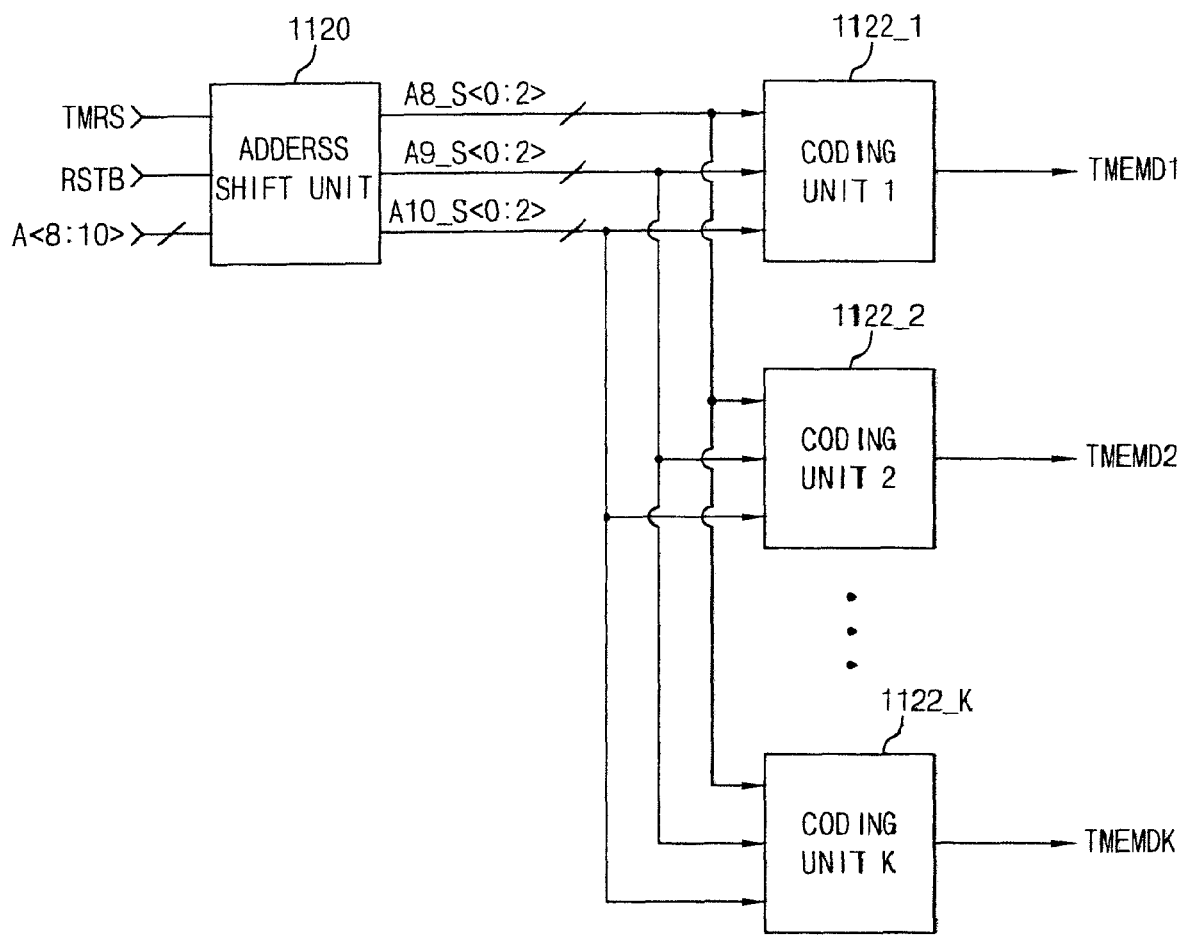
FIG. 11 is a detailed block diagram showing the test mode setting unit shown in FIG. 10.

The test entry mode setting unit 1100 includes an address shift unit 1120 and a plurality of coding units 1122_1 to 1122_K as shown in FIG. 11.

The configuration of the address shift unit 1120 may be identical to that of the address shift unit 520 shown in FIG. 4. The address shift unit 1120 shifts test entry mode setting addresses A<8:10>, which are sequentially inputted to the address shift unit 1120 in response to a test mode register set signal TMRS. The address shift unit 1120 thereby outputs shift addresses A8_S<0:2>, A9_S<0:2>, A10_S<0:2>.

The configurations of the coding units 1122_1 to 1122_K may be identical to those of the coding units described above (e.g., 542_1 to 542_K of FIG. 6). The coding units 1122_1 to 1122_K code the shift addresses A8_S<0:2>, A9_S<0:2>, A10_S<0:2> and output test entry mode signals TMEMD<1:K>.

The configuration of the test mode set signal generation unit 1200 may be identical to that of the test mode set signal generation unit 544 of FIG. 6. The test mode set signal generation unit 1200 outputs a test mode set signal TMSET corresponding to the test mode signals TMEMD<1:K>. That is, when at least one of the test entry mode signals TMEMD<1:K> is activated, the test mode set signal generation unit 120 activates the test mode set signal TMSET and outputs the test mode set signal TMSET.

The configuration of the test address decoding unit 1300 may be identical to that of the test address decoding unit 600 of FIG. 2. The test address decoding unit 1300 receives test mode setting addresses A<0:6> in response to the test mode register set signal TMRS. The test address decoding unit 1300 decodes the received test mode setting addresses A<0:6> to thereby output test address decoding signals TA<1:M> having information for a specific test.

The latch unit 1400 latches the respective test address decoding signals TA<1:M> in response to the test mode set signal TMSET and outputs latch signals TLAT<1:M>.

The configuration of the test mode signal output unit 1500 may be identical to that of the output unit 740 of FIG. 8. The test mode signal output unit 1500 controls each of the respective latch signals TLAT<1:M> in response to the test entry mode signals TMEMD<1:K> and outputs test mode signals TM<1:N>. That is, each of the test mode signals TM<1:K> corresponds to one of the test entry mode signals TMEND<1:K>, and a test mode signal TMi is output for a latched signal TLAT<1:M> in response to the latched signal TLAT<1:M> and according to whether the test entry mode signal TMENDi corresponding to the test mode signal TMi is activated.

As such, the test mode signal output unit 1500 outputs test mode signals TM<1:N> corresponding to the number M*K in proportion to the number M of latch signals TLAT<1:M> and the number K of test entry mode signals TMEMD<1:K>.

A test mode signal generator for a semiconductor memory device according to another embodiment of the present invention will be described with reference to FIG. 12.

Figure 12:
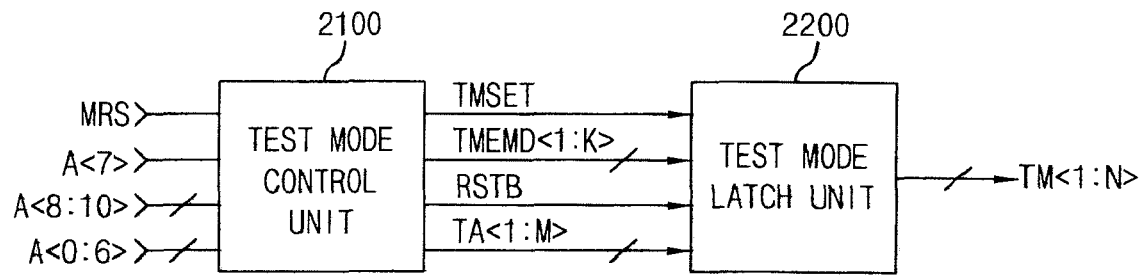
FIG. 12 is a block diagram showing a test mode signal generator for a semiconductor memory device according to another embodiment of the present invention.

As shown in FIG. 12, the test mode signal generator for the semiconductor memory device according to an embodiment of the present invention includes a test mode control unit 2100 and a test mode latch unit 2200.

The test mode control unit 2100 determines whether or not a test is performed according to a mode register set signal MRS and a test determination address A<7>. The test mode control unit also receives test entry mode setting addresses A<8:10> and test mode setting addresses A<0:6> in response to the determined result (i.e., the determination of whether or not a test is performed), and thereby outputs a test mode set signal TMSET, a plurality of test entry mode signals TMEMD<1:K> and test address decoding signals TA<1:M>.

The test mode latch unit 2200 latches the test address decoding signals TA<1:M> in response to the test mode set signal TMSET and outputs test mode signal TM<1:N> by allowing each latched signal to be controlled according to each of the respective test entry mode signals TMEMD<1:K>.

Figure 13:
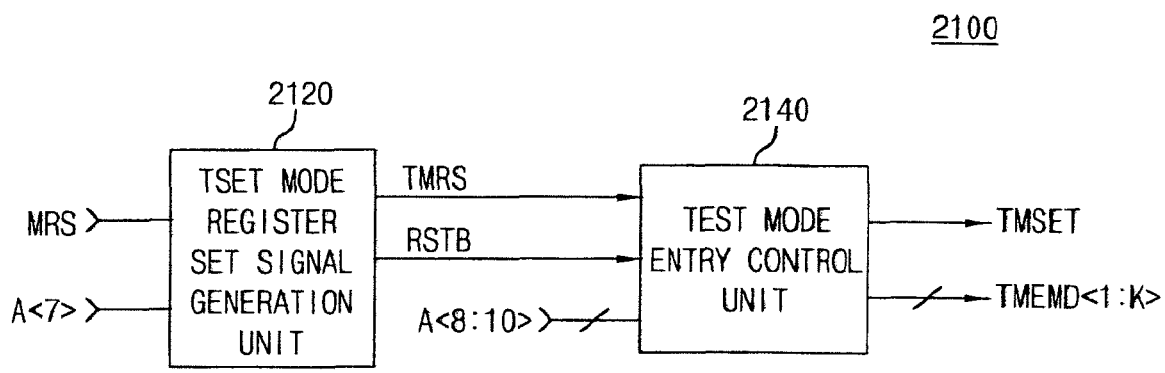
FIG. 13 is a detailed block diagram showing the test mode control unit shown in FIG. 12.
Figure 13:
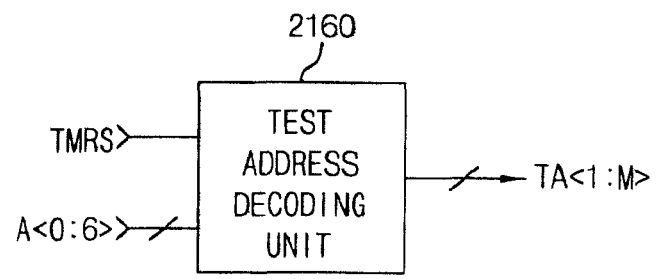

Referring to FIG. 13, the test mode control unit 2100 includes a test mode register set signal generation unit 2120, a test mode entry control unit 2140 and a test address decoding unit 2160.

The configuration of the test mode register set signal generation unit 2120 may be identical to that of the test mode register set signal generation unit 400 shown in FIG. 2. When both of the mode register set signal MRS and the test determination address A<7> are activated, the test mode register set signal generation unit 2120 activates a test mode register set signal TMRS and outputs the activated test mode register set signal TMRS so that a test is performed. When the mode register set signal MRS is activated in a state in which the test determination address A<7> is deactivated, the test mode register set signal generation unit 2120 activates a reset signal RSTB for ending the test and outputs the activated reset signal RSTB.

The test mode entry control unit 2140 receives test entry mode setting addresses A<9:10> in response to a test mode register set signal TMRS and codes the test entry mode setting addresses A<8:10> using a plurality of coding logic, thereby outputting a plurality of test entry mode signals TMEMD<1:K> and a test mode set signal TMSET.

Figure 14:
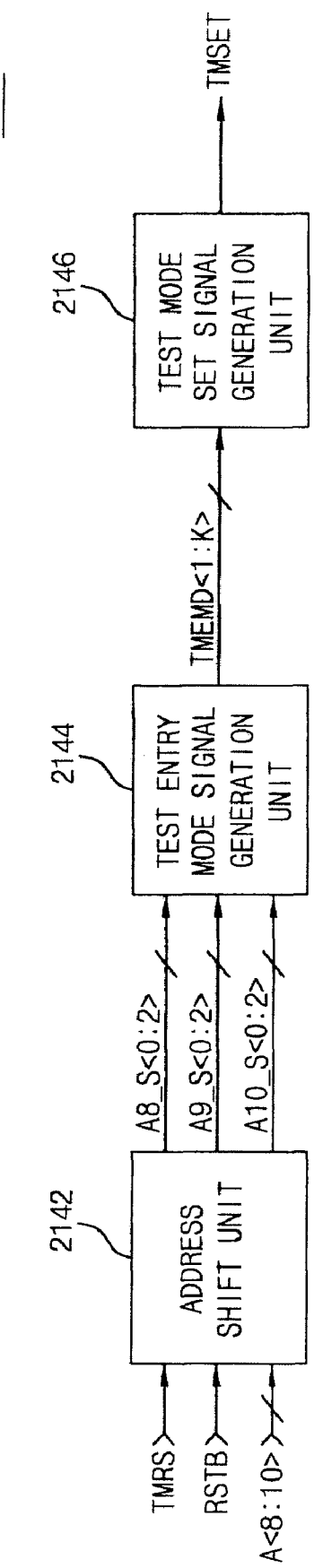
FIG. 14 is a detailed block diagram showing the test mode entry control unit shown in FIG. 13.

Specifically, the test mode entry control unit 2140 includes an address shift unit 2142, a test mode entry signal generation unit 2144 and a test mode set signal generation unit 2146 as shown in FIG. 14.

The configuration of the address shift unit 2142 may be identical to that of the address shift unit 520 shown in FIG. 4. The address shift unit 2142 shifts the test entry mode setting addresses A<8:10>, which are sequentially inputted to the address shift unit 2142 in response to the test mode register set signal TMRS, and the address shift unit 2142 outputs shift addresses A8_S<0:2>, A9_S<0:2>, A10_S<0:2>. The address shift unit 2142 is reset by the reset signal RSTB.

The configuration of the test mode entry signal generation unit 2144 may be identical to the examples of coding units 524_1 to 524_K shown in FIG. 6. The test mode entry signal generation unit 2144 codes the shift addresses A8_S<0:2>, A9_S<0:2>, A10_S<0:2> and outputs test entry mode signals TMEMD<1:K> as the coded result.

The configuration of the test mode set signal generation unit 2146 may be identical to that of the test mode set signal generation unit 544 shown in FIG. 6. The test mode set signal generation unit 2146 outputs the test mode set signal TMSET in response to the test entry mode signals TMEMD<1:K>. That is, when at least one of the test entry mode signals TMEMD<1:K> is activated, the test mode set signal generation unit 2146 activates the test mode set signal TMSET and outputs the activated test mode set signal TMSET.

Referring back to FIG. 13, the configuration of the test address decoding unit 2160 may be identical to that of the test address decoding unit 600 shown in FIG. 2. The test address decoding unit 2160 decodes test mode setting addresses A<0:6> in response to the test mode register set signal TMRS and outputs test address decoding signals TA<1:M>.

Figure 15:
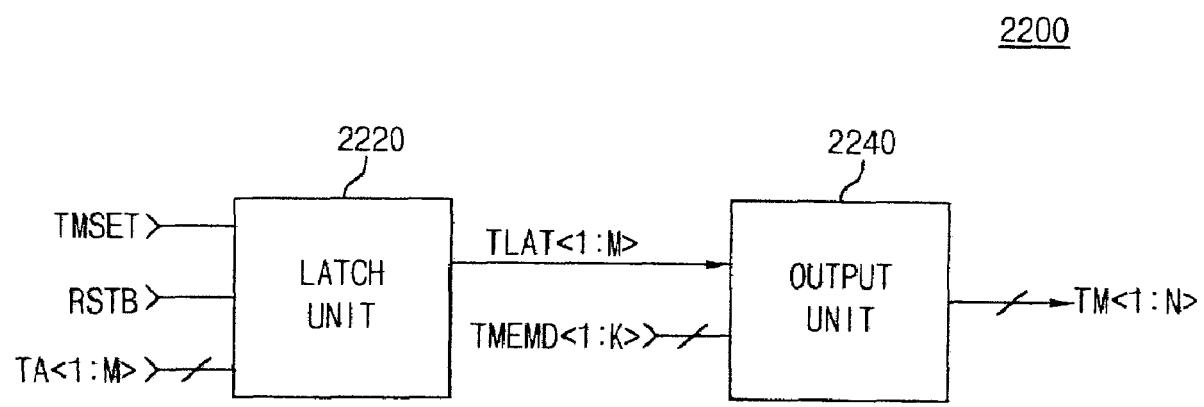
FIG. 15 is a detailed block diagram showing the test mode latch unit shown in FIG. 13.

Referring to FIG. 15, the test mode latch unit 2200 includes a latch unit 2220 and an output unit 2240.

The latch unit 2220 may include a plurality of the latch units 720 shown in FIG. 8), with the number of latch units 720 corresponding to the number M of test address decoding signals. The latch unit 2220 latches each of the test address decoding signals TA<1:M> in response to the test mode register set signal TMSET.

The output unit 2240 may include a plurality of the output units 740 shown in FIG. 8), with the number of the output units corresponding to the number M of test address decoding signals. The output unit 2240 allows the latch signals TLAT<1:M> outputted from the latch unit 2200 to be controlled according to the respective test entry mode signals TMEMD<1:K> in order to output test mode signals TM<1:N>. That is, each of the latch signals TLAT<1:M> may be input to a corresponding one of the output units, and in each output unit test mode signals TM<1:N> are output according to the corresponding latch signal and the test entry mode signals TMEND<1:K>.

As described above, in test mode signal generators for semiconductor memory devices according to the embodiments of the present invention described above, the number of test mode signals can be increased in proportion to the number of test entry mode signals without increasing the number of latch circuits, or the number of test mode signals can be increased without increasing the number of test mode setting addresses. Further, test mode signals having the same number as that of test mode signals in the related art test mode signal generator can be provided while decreasing the number of test mode setting addresses.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A test mode signal generator for a semiconductor memory device, comprising:
    a test mode entry control unit configured to receive a plurality of test entry mode setting addresses in response to a test mode register set signal, and configured to output a plurality of test entry mode signals and a test mode set signal according to the test entry mode setting addresses; and
    a latch unit configured to latch a plurality of test address decoding signals in response to the test mode set signal, and configured to output a plurality of test mode signals each corresponding to any one of the test entry mode signals, wherein the respective latched signals are controlled by the test entry mode signals to output as the test mode signals.

2. The test mode signal generator of claim 1, further comprising a test mode register set signal generation unit configured to receive a mode register set signal and a test determination address, wherein the test mode register set signal is generated according to the mode register set signal and the test determination address to set a test mode register.

3. The test mode signal generator of claim 1, wherein the test address decoding signals are generated by decoding a plurality of test mode setting addresses.

4. The test mode signal generator of claim 1, wherein the test mode entry control unit comprises:
an address shift unit configured to shift the test entry mode setting addresses to output a plurality of shift addresses, wherein the respective test mode setting addresses are sequentially inputted to the address shift unit in synchronization with the test mode register set signal; and
a test mode entry control signal generation unit configured to code the shift addresses, wherein the test mode entry control signal generation unit outputs the test entry mode signals as the coded result, and wherein the test mode entry control signal generation unit outputs the test mode set signal according to the test entry mode signals.

5. The test mode signal generator of claim 4, wherein the test mode entry control signal generation unit comprises:
a coding unit configured to code the shift addresses and configured to output the test entry mode signals as the coded result, wherein the respective test entry mode signals are activated according to coding logic of the coding unit and the shift addresses; and
a test mode set signal generation unit configured to activate the test mode set signal and configured to output the activated test mode set signal when at least one of the test entry mode signals is activated.

6. The test mode signal generator of claim 1, wherein the number of test mode signals outputted by the test mode latch unit is in proportion to the number of test address decoding signals and the number of test entry mode signals.

7. A test mode signal generator for a semiconductor memory device, comprising:
a test entry mode setting unit configured to receive a plurality of test entry mode setting addresses in response to a test mode register set signal, and configured to code the test entry mode setting addresses to output a plurality of test entry mode signals;
a test mode set signal generation unit configured to output a test mode set signal according to the test entry mode signals;
a test address decoding unit configured to receive a plurality of test mode setting addresses in response to the test mode register set signal, and configured to decode the test mode setting addresses to output a plurality of test address decoding signals;
a latch unit configured to latch the respective test address decoding signals in response to the test mode set signal to output a plurality of latch signals; and
a test mode signal output unit configured to output a plurality of test mode signals each corresponding to any one of the test entry mode signals, wherein the respective latch signals are controlled by the test entry mode signals to output as the test mode signals.

8. The test mode signal generator of claim 7, wherein the test mode register set signal is generated according to a received mode register set signal and test determination address, wherein the test mode register set signal is activated to set a test mode register when the mode register set signal and the test determination address are each activated.

9. The test mode signal generator of claim 7, wherein the test entry mode setting unit comprises:
an address shift unit configured to shift the test entry mode setting addresses to output a plurality of shift addresses, wherein the respective test mode setting addresses are sequentially inputted in synchronization with the test mode register set signal; and
a plurality of coding units each configured to code any one of the shift addresses such that the test entry mode signals is output from the coding units.

10. The test mode signal generator of claim 7, wherein the test mode set signal generation unit activates the test mode set signal and outputs the activated test mode set signal when at least one of the test entry mode signals is activated.

11. The test mode signal generator of claim 7, wherein the test mode signal output unit comprises a plurality of output units each corresponding to any one of the latch signals and each configured to output the test mode signals corresponding to the output unit, wherein the corresponding latch signal of each output unit is controlled by the test entry mode signals to output the test mode signals corresponding to the output unit.

12. The test mode signal generator of claim 11, wherein the number of the test mode signals outputted by the test mode signal output unit is in proportion to the number of latch signals and the number of test entry mode signals.

13. A test mode signal generator for a semiconductor memory device, comprising:
a test mode control unit configured to receive a plurality of test entry mode setting addresses and a plurality of test mode setting addresses in response to a mode register set signal and a test determination address, and configured to output a test mode set signal, a plurality of test entry mode signals and a plurality of test address decoding signals; and
a test mode latch unit configured to latch the test address decoding signals in response to the test mode set signal, and configured to output the latched signals as a plurality of test mode signals, wherein the respective latched signals are controlled by the test entry mode signals to output as the test mode signals.

14. The test mode signal generator of claim 13, wherein the test mode control unit comprises:
a test mode register set signal generation unit configured to output a test mode register set signal for determining whether or not a test is performed in response to the mode register set signal and the test determination address;
a test mode entry control unit configured to receive the test entry mode setting addresses in response to the test mode register set signal and configured to code the test entry mode setting addresses to output the test entry mode signals and the test mode set signal; and
a test address decoding unit configured to decode the test mode setting addresses in response to the test mode register set signal to output the test address decoding signals.

15. The test mode signal generator of claim 14, wherein the test mode register set signal generation unit activates the test mode register set signal and outputs the activated test mode register set signal when each of the mode register set signal and the test determination signal are activated.

16. The test mode signal generator of claim 14, wherein the test mode register set signal generation unit outputs a reset signal for ending the test when the mode register set signal is activated and the test determination address is deactivated.

17. The test mode signal generator of claim 14, wherein the test mode entry control unit comprises:
an address shift unit configured to shift the test entry mode setting addresses to output a plurality of shift addresses, wherein the respective test mode setting addresses are sequentially inputted to the address shift unit in response to the test mode register set signal;

a test entry mode signal generation unit configured to code the shift addresses to output the test entry mode signals; and a test mode set signal generation unit configured to output the test mode set signal in response to the test entry mode signals.

18. The test mode signal generator of claim 13, wherein the test mode latch unit comprises:

a latch unit configured to latch the test address decoding signals in response to the test mode set signal; and an output unit configured to output the test mode signals each corresponding to any one of the test entry mode signals, wherein the respective latched signals are controlled by the test entry mode signals to output as the test mode signals.

19. A method of generating test mode signals for a semiconductor memory, comprising:

shifting a plurality of test entry mode setting addresses sequentially inputted in response to a test mode register set signal to generate a plurality of shift addresses;

coding the shift addresses to output a plurality of test entry mode signals;

outputting a test mode set signal, wherein the test mode set signal is activated when at least one of the test entry mode signals is activated;

outputting test address decoding signals and latching the test address decoding signals in response to the test mode set signal; and outputting a plurality of test mode signals each corresponding to any one of the test entry mode signals, wherein the test mode signals are output according to the test entry mode signals and the latched test address decoding signals.

20. The method of claim 19, wherein the test mode register set signal is generated in response to a mode register set signal and a test determination address to set a test mode register.

21. The method of claim 19, wherein the test address decoding signals are signals having test information and are obtained by decoding a plurality of test mode setting addresses that are decoded in response to the test mode register set signal.

22. The method of claim 19, wherein the number of the test mode signals is in proportion to the number of test entry mode signals and the number of test address decoding signals.

23. A method of generating test mode signals for a semiconductor memory, comprising:

receiving a plurality of test entry mode setting addresses, wherein the test entry mode setting addresses are inputted in response to a test mode register set signal;

outputting a plurality of test entry mode signals and a test mode set signal according to the test entry mode setting addresses;

latching a plurality of test address decoding signals in response to the test mode set signal; and outputting a plurality of test mode signals each corresponding to any one of the test entry mode signals, wherein the latched test address decoding signals are controlled by the test entry mode signals to output the test mode signals.

24. The method of claim 23, wherein the test mode register set signal is generated in response to a mode register set signal and a test determination address to set a test mode register.

25. The method of claim 23, wherein the test address decoding signals are signals generated by decoding a plurality of test mode setting addresses.

26. The method of claim 23, further comprising shifting the test entry mode setting addresses to output a plurality of shift addresses, and coding the shift addresses using a plurality of coding logic to output the test entry mode signals, wherein the test entry mode setting addresses are sequentially inputted in response to the test mode register set signal in order to shift the test entry mode setting addresses.

27. The method of claim 23, wherein the test mode set signal is activated when at least one of the test entry mode signals is activated.

28. The method of claim 23, wherein the number of test mode signals is in proportion to the number of test entry mode signals and the number of test address decoding signals.

* * * * *